United States Patent [19]
Koike

[11] Patent Number: 5,784,304
[45] Date of Patent: Jul. 21, 1998

[54] ADAPTIVELY CONTROLLED FILTER

[75] Inventor: Shin'Ichi Koike, Tokyo, Japan

[73] Assignee: NEC Corporation, Tokyo, Japan

[21] Appl. No.: 594,172

[22] Filed: Jan. 31, 1996

[30] Foreign Application Priority Data

Feb. 1, 1995 [JP] Japan ................... 7-014842

[51] Int. Cl.[6] ........................... G06F 17/10
[52] U.S. Cl. ........................... 364/724.19
[58] Field of Search ............ 364/724.19, 724.2; 375/232–236

[56] References Cited

FOREIGN PATENT DOCUMENTS 2-65310   3/1990   Japan .

OTHER PUBLICATIONS

Seung Chan Bang et al., "A Robust Adaptive Algorithm and Its Performance Analysis with Contaminated–Gaussian Noise", *Proceedings of the International Workshop on Intelligent Signal Processing and Communication Systems*, Oct. 5–7, 1994, pp. 295–300.

C.P. Kwong, "Performance and design of the dual sign algorithm with correlated input data," *8094f IEE Proceedings*, vol. 136, Pt. F, No. 6, Dec. 1989, pp. 269–275.

José M.P. Borrallo et al., "Convergence analysis of stochastic gradient adaptive algorithms for arbitrary error surfaces," *Signal Processing VI, Theories and Applications* (1992), pp. 1073–1076.

*Primary Examiner*—Tan V. Mai
*Attorney, Agent, or Firm*—Sughrue, Mion, Zinn, Macpeak & Seas, PLLC

[57] ABSTRACT

An rms value of a sum signal series $x=e_n+v_n$ calculated by adding a noise series to an error signal series of a known signal series and an unknown signal series, is calculated by an rms calculator. By means of an amplitude controller, x is output as is when $|x|$ is smaller than a threshold value A proportional to the rms value. When $|x|$ is greater than the threshold value A, a product signal calculated by multiplying the polarity of x with the threshold value is output. Utilizing the output of the amplitude controller, respective tap weights of filter is corrected to generate be tap weights $C_k^{(n)}$. By this, switching control between a probability gradient LMS algorithm (LA) and a probability gradient sign algorithm (SA) can be performed smoothly. Thus, an adaptively controlled filter having an advantage of small residual error and fast convergence of LA and an advantage of satisfactory strength against disturbance, such as burst noise or so forth of SA, can be obtained.

8 Claims, 8 Drawing Sheets

ADAPTIVELY CONTROLLED FILTER

BACKGROUND OF THE INVENTION

1. Field of the Invention

The present invention relates generally to an adaptively controlled filter. More specifically, the invention relates to an adaptively controlled filter to be used in an echo canceler, a digital data transmission equalizer employed in a data transmission and an acoustic system or in identification of unknown system, and to be adapted to input a known signal series to output a predicted signal series of unknown signal series.

2. Description of the Related Art

Figure 10:
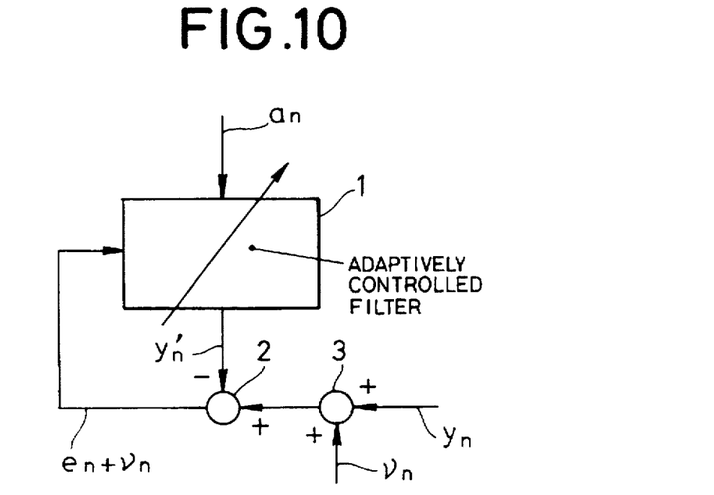
FIG. 10 is an illustration showing a principle of the adaptively controlled filter.

At first, discussion will be given for principle of this type of adaptively controlled filter with reference to FIG. 10. In FIG. 10, a replica yn' of an unknown signal yn is generaged from an unknown signal series by means of a filter 1. Then, an error signal en of the unknown signal yn and the replica yn' by means of a subtractor 2. On the basis of the error signal en, parameters of the filter 1 are updated to correctly identify the unknown signal yn.

At this time, since a noise vn upon measurement is usually added to the unknown signal yn, a signal, in which the noise vn is added to the unknown signal yn, is taken as one input of the subtractor 2.

The adpatively controlled filter converges from a non-learnt initial state to a final state. On the other hand, the unknown signal is provided as a response corresponding to the input signal an of the unknown system.

Figure 11:
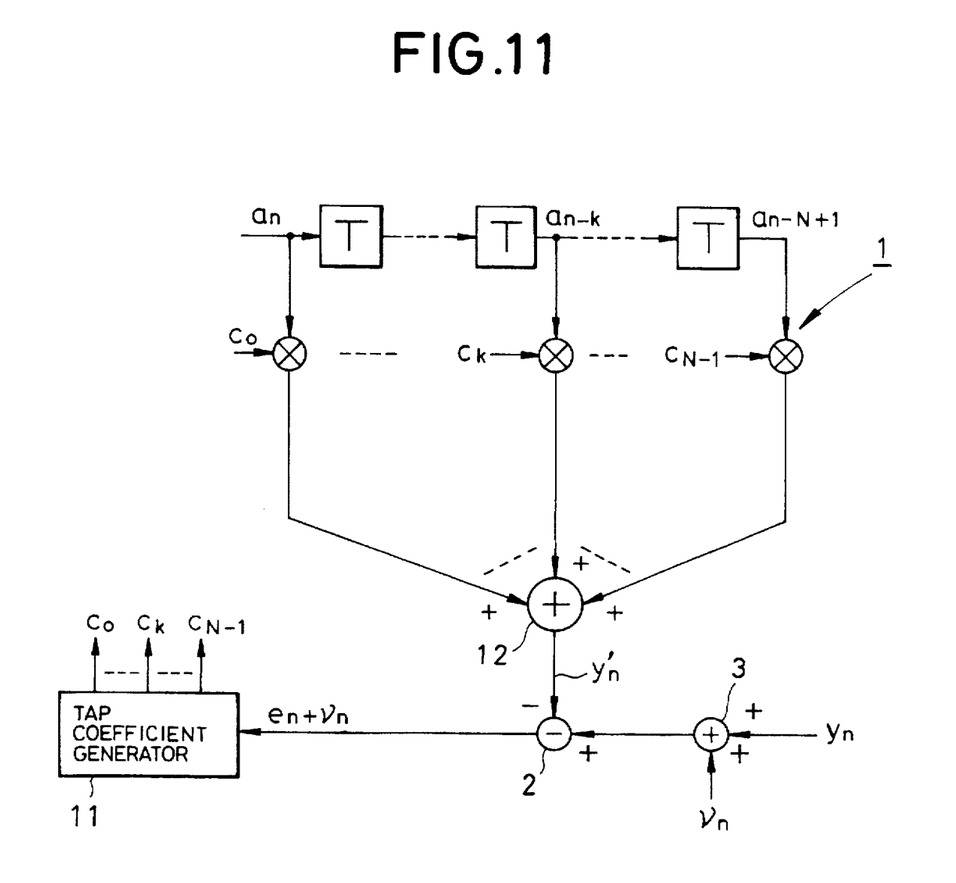
FIG. 11 is a block diagram showing one example of the adaptively controlled filter.

The adaptively controlled filter is mostly realized as a non-recursive digital filter (FIR: finite impulse response) and may have a construction as illustrated in FIG. 11. For values an ..., an-k, ..., an−N+1 at respective taps of the input signal, tap weight C0, ..., Ck, ... CN-1 are respectively multiplied. All of the products of multiplication are added in the adder 12 to generate the replica yn'.

At this time, utilizing a sum of the error signal en and the noise vn, respective tap weights of respective taps C0, C1, ..., CN-1 are controlled. For this purpose, a tap weight generator 11 is provided. It should be noted that N is the number of the taps.

Here, $$en = yn - yn'$$

$$yn' = \Sigma\ an-i\cdot Ci$$

is established. Σ indicates a sum over i=0 to N−1.

As a control algorithm of the tap weight for convergence of the adaptively controlled filter, the following two algorithms are frequently employed industrially.

Namely, with respect to k=0, 1 ..., N−1, there are stochastic gradient LMS '(least mean square) algorithm (hereinafter abbreviated as "LA") and a stochastic gradient sign algorithm (hereinafter abbreviated as "SA"). The former, i.e. LA, is expressed by:

$$Ck^{(n+1)} = Ck^{(n)} + \alpha c*(en+vn)*an-k$$

and the latter, i.e. SA is expressed by:

$$Ck^{(n+1)} = Ck^{(n)} + \alpha c*sgn\ (en+vn)*an-k$$

Wherein * represents multiplication

Here, $Ck^{(n)}$ is the tap weight value at a time n, αc is a step size (coefficient of the tap weight adjustment), and sgn (x) is a function providing a polarity.

$$sgn(x) = -1\ (x<0)$$

$$sgn(x) = 1\ (x>0)$$

Figure 12A:
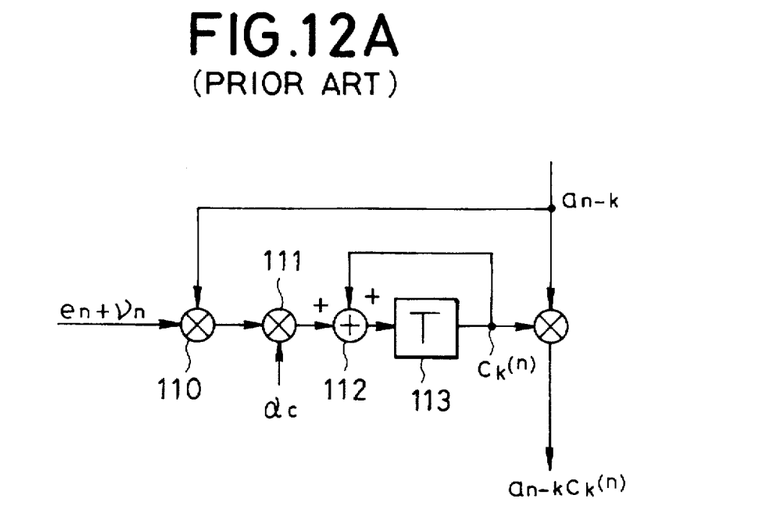
FIG. 12A and 12B are illustrations showing the prior art of a weight generator 11 of FIG. 11.
Figure 12B:
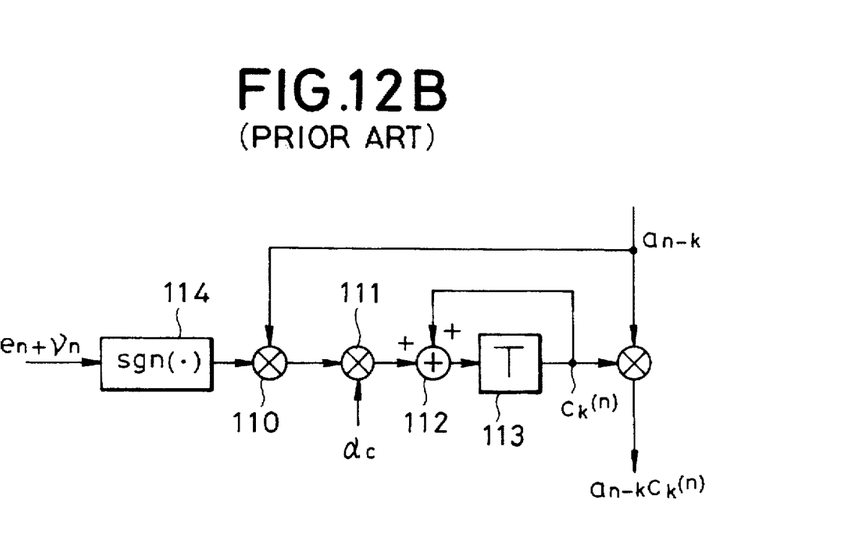

Circuit constructions realizing these two algorithms are shown in FIGS. 12A and 12B, respectively. In FIGS. 12A and 12B, there are only illustrated with respect to the tap weight value $ck^{(n)}$ of the k - th tap.

FIG. 12A shows an algorithm of LA system, in which a product of the sum (en+vn) of the error signal en and the noise signal vn, and a known signal an - k by a multiplexer 110, and the product thus derived is multiplied with a predetermined adjustment coefficient αc (step size) by a multiplier 111. The product derived from this multiplication is added to the tap weight of the preceding time slot by an adder 112 to derive a new tap weight $Ck^{(n+1)}$. It should be noted that the reference numeral 113 denotes a delay for a time slot (corresponding to a period of one sample symbol on a signal series).

FIG. 12B shows an algorithm of SA system. In which polarity of (en+vn) is derived by a polarity generator 114. Subsequent construction is the same as the algorithm of the LA system shown in FIG. 12A.

In the LA system, calculation of (en+vn)*an−k is a calculation of analog values and requires large amount of bit calculation in the digital signal processing technology. In contrast to this, in the SA system, since sgn (en+vn) can be expressed by one bit, calculation becomes quite simple. However, it has been well known, that under presence of noise vn, if the step size αc is selected so that the residual error (power) after convergence becomes equal, faster convergence can be attained in the LA system.

On the other hand, it is also well known that, in the SA system, since the polarity of (en+vn) is calculated, even when disturbances, such as burst noise of large amplitude and so forth are contained in the measuring system, the noise amplitude is limited to make the system more stable than the LA system.

As an example employing the LA system and the SA system, there is a technology disclosed in Japanese Unexamined Patent Publication (Kokai) No. Heisei 2-65310. In the disclosed technology, by switching the LA algorithm and the SA algorithm with a fixed reference value, convergence of the adaptive filter is intended to be enhanced.

In the conventional Japanese Unexamined Patent Publication No. Heisei 2-65310, in order to guarantee satisfactory convergence of the adaptive filter, the SA algorithm is employed. Since the disclosed system switches the algorithm when the predetermined fixed reference value is reached, while the convergence can be guaranteed, it becomes impossible to obtain the adaptive filter which is robust against the burst noise penetrated into the system and thus cannot provide sufficient robusteness against disturbances.

SUMMARY OF THE INVENTION

It is therefore an object of the present invention to provide an adaptive filter which can achieve sufficiently smaller residual error and strength against disturbance.

In order to accomplish the above-mentioned and other objects, an adaptively controlled filter for inputting a known signal and outputting a replica signal of an unknown signal, in accordance with one aspect of the invention, comprising:

input terminal supplied with a sum signal of said unknown signal and a noise signal;

error signal generating means for generating an error signal of the unknown signal and the replica signal;

tap weight generator means for generating a weight to be multiplied by a value of the known signal depending upon the sum signal, the weight generator means including:

threshold value generating means for calculating an average power of the sum signal and thus deriving a threshold value A depending upon the level of the average power;

amplitude control means for outputting the sum signal when an absolute value of the amplitude of the sum signal is smaller than the threshold value A and outputting a product calculated by multiplying sgn (x) indicative of polarity of the, sum signal x to a predetermined value within a range of the threshold value A and 0 when an absolute value of the amplitude of the sum signal is greater than the threshold value A;

multiplying means for multiplying a predetermined adjustment coefficient with the product of the output of the amplitude and values at respective taps of the known signal; and adding means for adding the product calculated by the multiplying means to the tap weight for deriving a sum which serves as new tap weight.

In the preferred construction, the threshold signal generating means may include an average power calculating means for deriving an average power of the sum signal and rms calculating means for calculating an a square root value of the average power as an rms value. In such case, the threshold value generating means may further comprise means for generating a value proportional to the rms value as the threshold value A.

The average power calculating means may comprise a leaky accumulator including a first multiplier for multiplying a square value of the sum signal and a constant $(1-\beta)$ $(0<\beta<1)$, a second multiplier for multiplying the average power of one preceding sample symbol of the sum signal with a constant $\beta$, and an adder for adding the products calculated by the first and second multipliers and outputting as the most recent average power.

On the other hand, the amplitude control means may output a product of the threshold value A and the sgn(x) when the absolute value of amplitude of the sum signal is greater than the threshold value. In the alternative, the amplitude control means may output 0 when the absolute value of amplitude of the sum signal is greater than the threshold value. In the further alternative, the amplitude control means may output $f(x)=\alpha x \pm a$ (wherein $|f(x)|<A$ and $\alpha$, a are constant satisfying $a>A$ and $0>\alpha>-\infty$, respectively) when the absolute value of amplitude of the sum signal is greater than the threshold value.

The amplitude control means may be a memory taking the threshold value A and the sum signal x as address inputs and storing predetermined output values respectively corresponding to the address inputs.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

An embodiment of an adaptively controlled filter according to the present invention will be discussed hereinafter with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessarily obscure the present invention.

Figure 1:
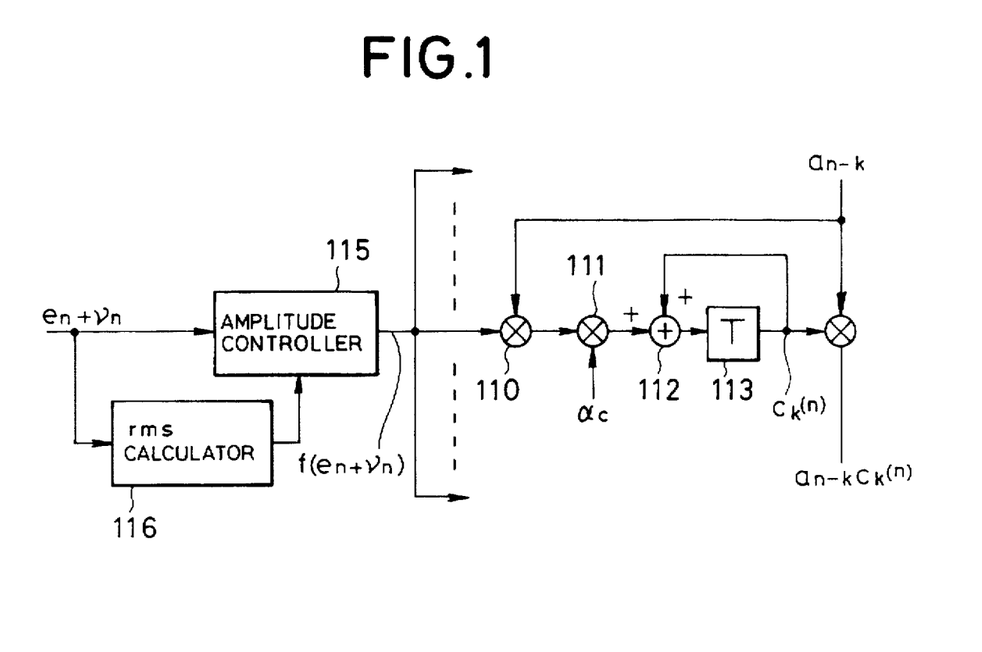
FIG. 1 is a block diagram of one embodiment of an adaptively controlled filter according to the present invention.

In the embodiment of the present invention, while system constructions are the same as those of FIGS. 10 and 11, the concrete construction of a tap weight generator 11 is differentiated. FIG. 1 shows an example of the tap weight generator 11. It should be noted that, in FIG. 1, like elements to FIGS. 12A and 12B are represented by like reference numerals.

A sum signal series (en+vn) of the error signal en and the noise vn (see FIGS. 10 and 11) is input to an rms calculator 116. Then, an average power of rms value (root mean square value) is calculated.

On the other hand, the sum signal is also input to an amplitude controller 115 and is compared with the rms value to generate an output signal f(en+vn) having an amplitude depending upon a result of the comprison between the sum signal and the rms value.

The output signal is input to the multiplier 110 and multiplied by the value an-k of the known signal at the respective tap. The product of multiplication is corrected by multiplying the adjustment coefficient $\alpha c$ by the multiplier 111, and then added to the tap weight $C_k^{(n)}$ of the immediately preceding time slot by the adder 112 to output the new tap weight $C_k^{(n+1)}$.

This is expressed by the following equation:

$$Ck^{(n+1)=Ck(n)}+\alpha c*f(en+vn)*an-k$$

Figure 2:
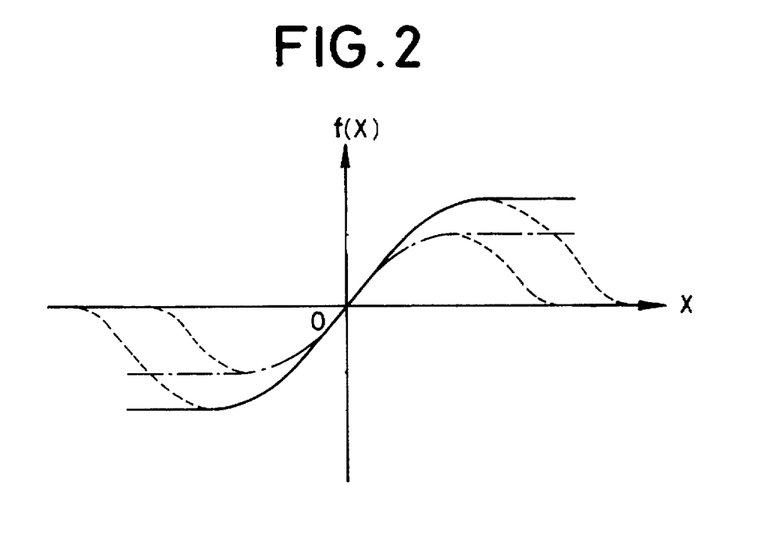
FIG. 2 is an input/output characteristic chart of an amplitude controller 115 of FIG. 1.

This non-linear function f(x) is generally takes in a form as illustrated in FIG. 2. When the absolute value of x becomes smaller than the threshold determined by the rms value, the value of x is used as it is, and when the absolute value x is greater than the threshold value, a value depending upon the polarity is used.

In the graph of the non-linear function f(x), as shown by solid and one-dotted line, the upper and lower limit values of the function value can be arbitrarily differentiated by specific parameter.

The simplest way for realizing this f(x) is to output x when the absolute value of x is smaller than a threshold value A. When the absolute value x is greater than the threshold value A, the non-linear function f(x) can be realized by employing an amplitude controller 115 outputting Asgn(x).

Namely, it can be expressed as:

$$f(x)=x \quad |x|<A$$

$$f(x)=Asgn(x) \quad |x|>A$$

Figure 3A:
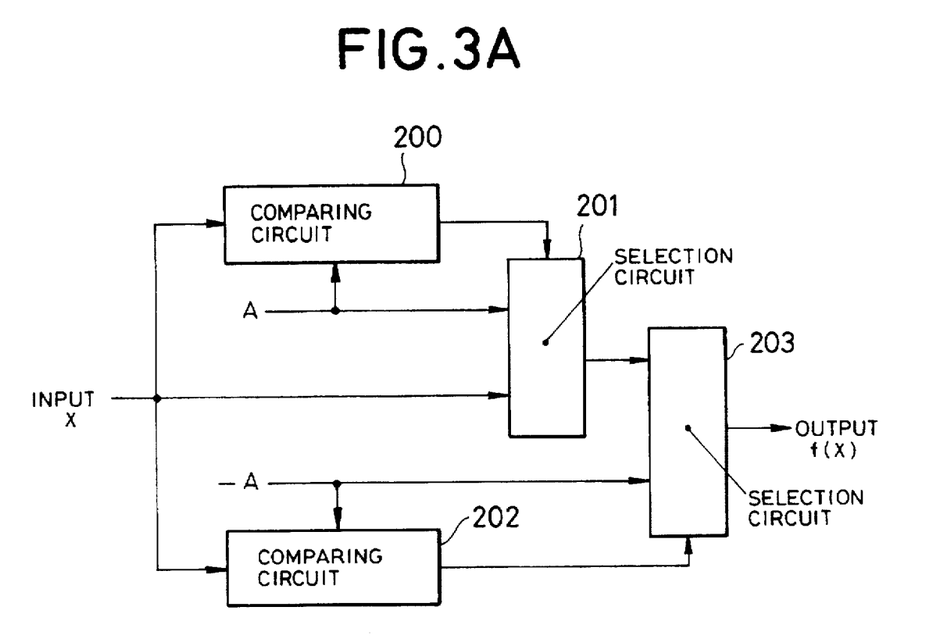
FIG. 3A is a block diagram showing one embodiment of the amplitude controller 115.
Figure 3B:
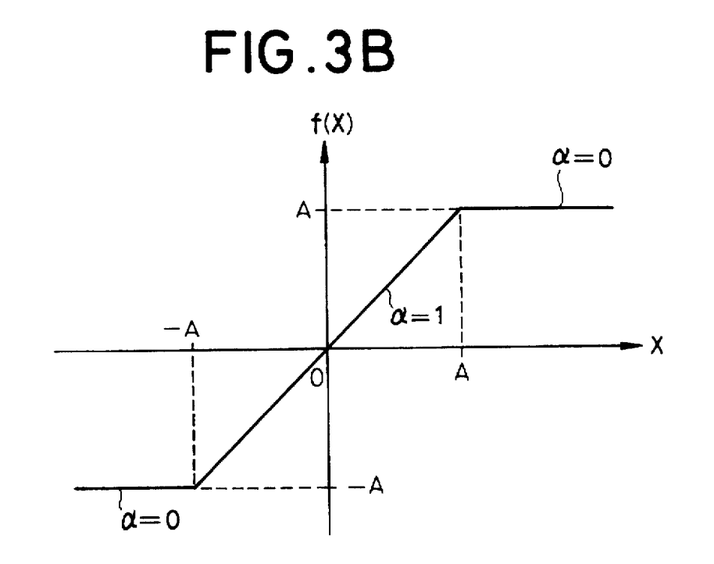
FIG. 3B is an input/output characteristics of the amplitude controller 115 of FIG. 3A.

FIG. 3B shows its configuration which correspondes to the non-linear function shown by the solid line or the one-dotted line in FIG. 2, and FIG. 3A is a circuit realizing the foregoing function.

In FIG. 3A, the input x is supplied to two comparator circuits 200 and 202 and respectively compared with threshold values ±A. A selection circuit 201 outputs A or x depending upon the result of comparison by the comparing circuit 200. Namely, if x>A, A is selected and output and if x≦A, x is selected and output.

A selection circuit 203 outputs −A or the output of the selection circuit 201, depending upon the result of comparison by the comparing circuit 200. Namely, if x<−A, −A is selected and output and if x≧−A, the output of the selection circuit 201 is selected and output.

Next, discussion will be given for rms calculator 116 of FIG. 1. In general, at the initial stage of convergence of the adaptively controlled filter, the average power <en²> of the residual error becomes large. According to progress of convergence, the average power becomes smaller and reaches it's minimum. Thus, the average power <(en+vn)²> of (en+vn) at each time is derived. The threshold value A at the time is derived by:

$$A = M\sqrt{<(en+vn)^2>}$$

Here, the coefficient M will be an appropriate value in the range of 1 to 2 in view of amplitude distribution of (en+vn).

It should be noted that <(en+vn)²> can be derived from past L in number of data of (en+vn) by generating an average value as:

$$(1/L) \Sigma (en-i+vn-i)^2$$

It should be noted that Σ indicates a sum over i=0 to L−1.

Figure 4:
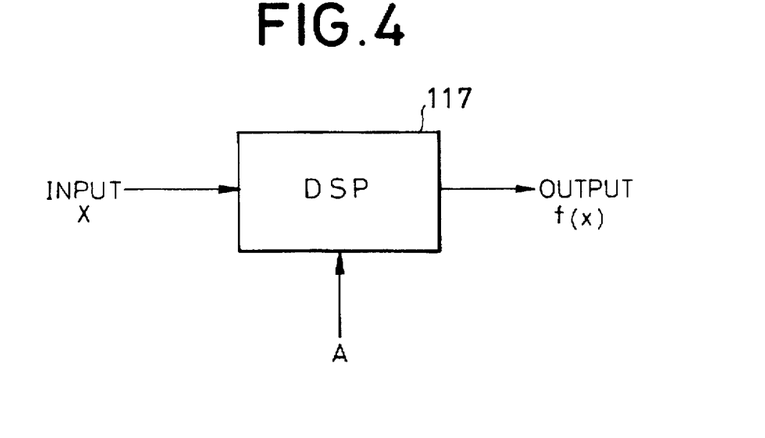
FIG. 4 is a block diagram showing another embodiment of the amplitude controller 115.
Figure 5:
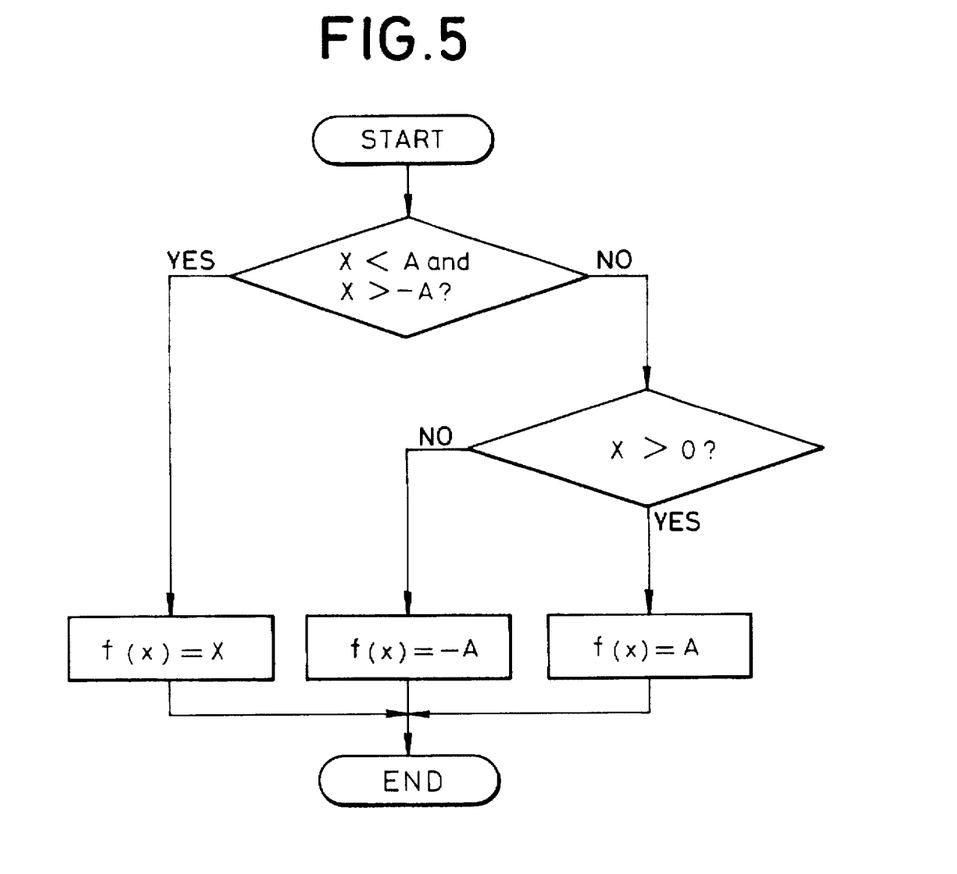
FIG. 5 is a flowchart showing operation of the amplitude controller 115 of FIG. 4.

As another example of the amplitude controller 115 of FIG. 1. As shown in FIG. 4, the amplitude controller 115 is realized with a flowchart shown in FIG. 5, by employing a DSP (digital signal processor) 117.

Figure 6A:
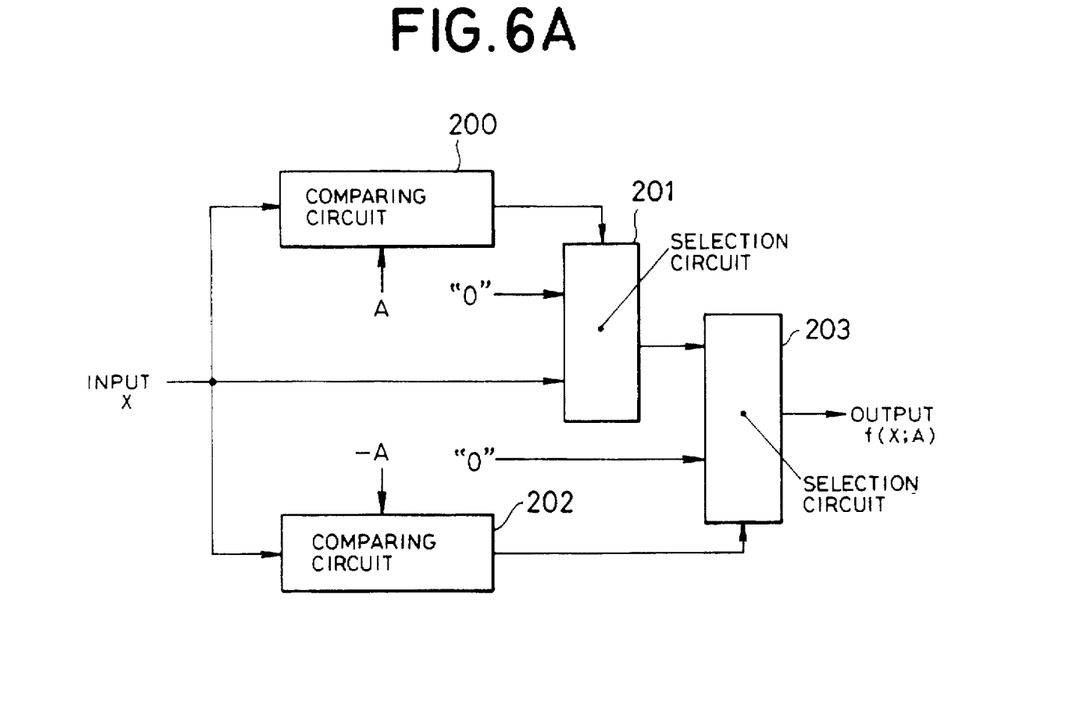
FIG. 6A is a block diagram showing a further embodiment of the amplitude controller 115.
Figure 6B:
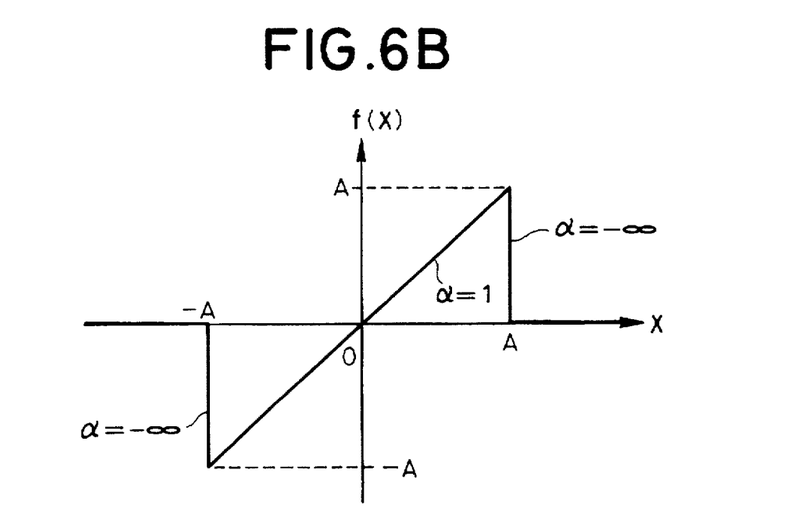
FIG. 6B is an input/output characteristics of the amplitude controller 115 of FIG. 6A.

As another example of the non-linear function f(x), it is possible to employ those illustrated in FIG. 6B. The expressions used in FIG. 6B are:

$$f(x)=x \quad |x|<A$$

$$f(x)=0 \quad |x|>A$$

This can be realized by the circuit illustrated in FIG. 6A.

In FIG. 6A, the inputs of respective selection circuits 201 and 203 of FIG. 3A are realized by using "0" in place of "A". It should be obvious that the DSP 117 of FIG. 4 can be employed in realizing the circuit of FIG. 6A.

Figure 7:
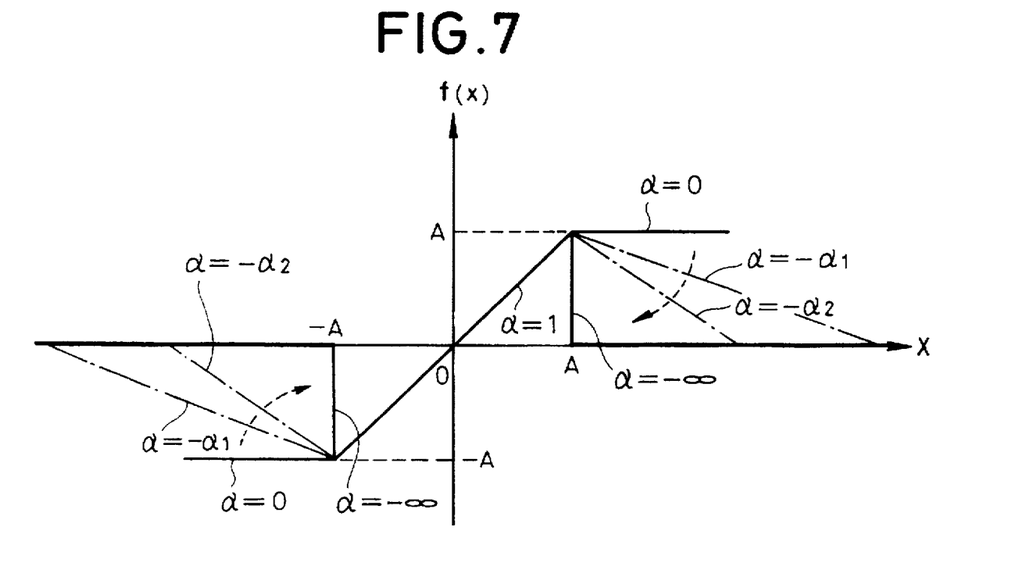
FIG. 7 is an illustration showing a still further example of input/output characteristics of the amplitude controller 115.

A further embodiment of the amplitude controller 11 may be realized by outputting the non-linear function f(x) as illustrate in FIG. 7. In the f(x) of FIG. 3B, when the absolute value of x exceeds A, the output amplitude is restricted at a constant value A by controlling the gradient from α=1 to α=0. In case of the f(x) of FIG. 6B, when the absolute value of x exceeds A, the output amplitude is restricted to be a constant value 0 by controlling from α=1 to α=−∞.

Figure 8:
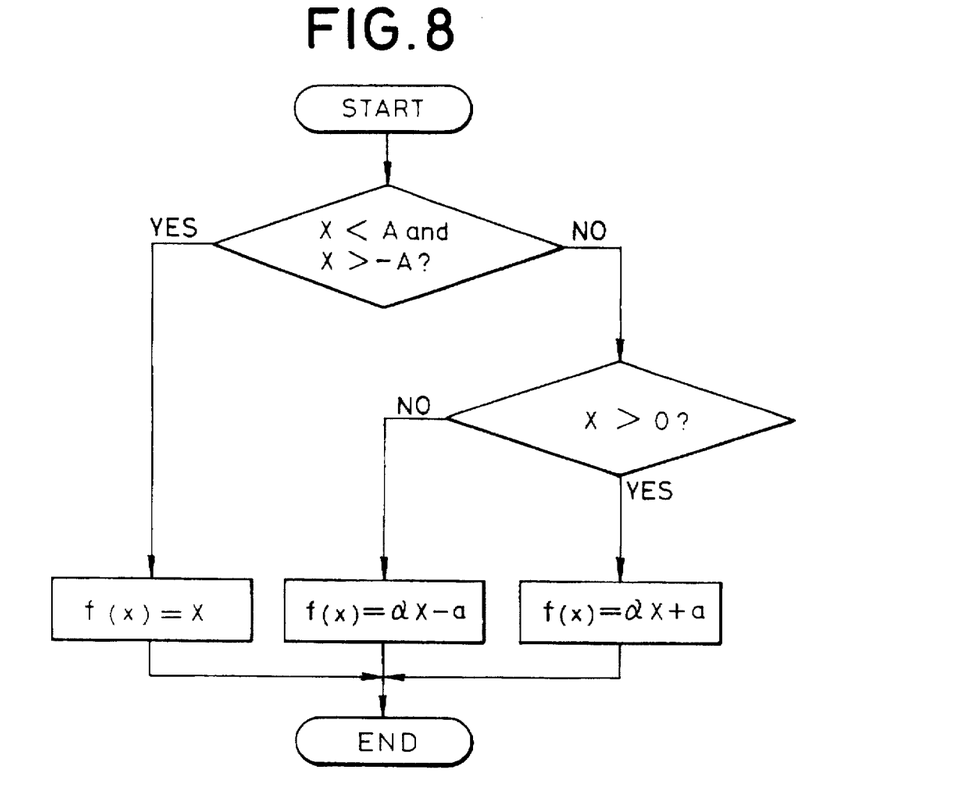
FIG. 8 is a flowchart showing embodiment of the amplitude controller of FIG. 7.

On the other hand, in FIG. 7, when the absolute value x exceeds A, the gradient α is controlled at arbitrary value α1 or α2 within a range of 0 to −∞ to restrict the output amplitude at a value between A to 0. For this purpose, it is possible to determine the flowchart of operation of the DSP 117 of FIG. 4 as shown in FIG. 8. It should be noted that, in FIG. 8, a is a positive value greater than A. The configuration in FIG. 7 corresponds to the non linear function shown by the dotted lines in FIG. 2.

Also, by employing a ROM table, the amplitude controller may be realized by storing the function values of f(x)= αx±a in the entry of the address portions of respective input with taking x and A in the ROM table as corresponding input addresses.

Figure 9:
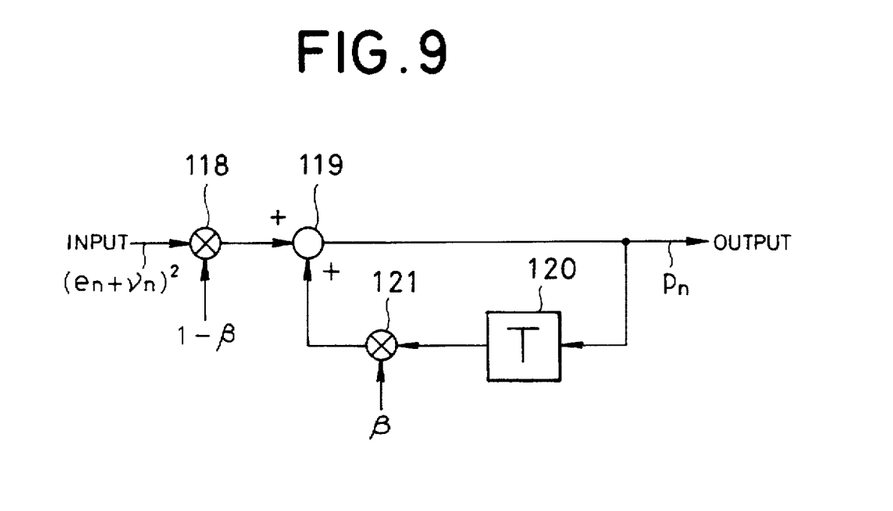
FIG. 9 is a block diagram showing one example of an averaged power calculating portion in rms calculator 116 in FIG. 1.

As an example of the average power calculating portion of the rms calculator 116 (FIG. 1), an integrator is generally employed. It is also possible to employ a leaky accumulator for realizing the average power calculating portion of the rms calculator 116. FIG. 9 shows an example of the leaky accumulator. By multiplying (en+vn)² and (1-β) (0<β<1) by a multiplier 118, and the product of multiplication is taken as one input of an adder 119.

The output of the adder 119 is input to a delay element 120 to obtain a value of one preceding time slot. The delayed output is multiplied with β by a multiplier 121 to take the product thereof as another input of the adder 119.

With the construction set forth above, a progressive expression Pn as the output of the adder 119 is expressed by:

$$Pn=(1-\beta)*(en+vn)^2+\beta*Pn-1$$

Through the foregoing equation, an average power is derived. Thus, A can be attained by deriving the rms value of the average power.

As set forth above, according to the present invention, with taking the value proportional to the rms value of the power value of the sum signal of the error signal and the noise at respective timing as threshold value, by comparing the threshold value and the amplitude of the sum signal at respective moment to switch algorithm between LA system and SA system depending upon the result of comparison, switching between the LA system and the SA system can be smoothly and sequentially done. Therefore, it becomes possible to obtain the adaptively controlled filter which has small residual error and fast convergence of the LA system, and robustness against disturbance, such as the burst noise and so forth of the SA system.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. An adaptively controlled filter for inputting a known signal and outputting a replica signal of an unknown signal, comprising:

input terminal supplied with a sum signal of said unknown signal and a noise signal;

error signal generating means for generating an error signal of said unknown signal and said replica signal;

tap weight generator means for generating a tap weight to be multiplied by a value of the known signal depending upon said sum signal, said tap weight generating means comprising:

threshold value generating means for calculating an average power of said sum signal and deriving a threshold value A depending upon the level of said average power;

amplitude control means for outputting said sum signal when an absolute value of the amplitude of an amplitude of said sum signal is smaller than said threshold value A, and outputting a product calculated by multiplying a value sgn(x) indicative of polarity of said sum signal x with a predetermined value within a range of said threshold value A and 0 when said absolute value of the amplitude of said sum signal is greater than said threshold value A;

multiplying means for multiplying a predetermined adjustment coefficient with the product of an output of said amplitude and values at respective taps of said known signal; and adding means for adding the product calculated by said multiplying means to said tap weight for deriving a sum which serves as a new tap weight.

2. The adaptively controlled filter as set forth in claim 1, wherein said threshold signal generating means includes an average power calculating means for deriving the average power of said sum signal and rms calculating means for calculating a square root value of the average power as an rms value.

3. The adaptively controlled filter as set forth in claim 2, wherein said threshold value generating means further comprises means for generating a value proportional to said rms value as the threshold value A.

4. The adaptively controlled filter as set forth in claim 3, wherein said amplitude control means outputs a product of said threshold value A and said sgn(x) when the absolute value of amplitude of said sum signal is greater than said threshold value.

5. The adaptively controlled filter as set forth in claim 3, wherein said amplitude control means outputs 0 when the absolute value of amplitude of said sum signal is greater than said threshold value.

6. The adaptively controlled filter as set forth in claim 3, wherein said amplitude control means outputs $f(x)=a \pm a$ (wherein $|f(x)|<A$ and , a are constant satisfying a>A and 0>>—, respectively) when the absolute value of amplitude of said sum signal is greater than said threshold value.

7. The adaptively controlled filter as set forth in claim 7, wherein said amplitude control means comprises a memory having the threshold value A and said sum signal x as address inputs and storing predetermined output values respectively corresponding to said address inputs.

8. The adaptively controlled filter as set forth in claim 2, wherein said average power calculating means comprises a leaky accumulator including a first multiplier for multiplying a square value of said sum signal and a constant $(1-\beta)$ $(0 <\beta<1)$, a second multiplier for multiplying the average power of one preceding sample symbol of said sum signal with a constant $\beta$, and an adder for adding products respectively calculated by said first and second multipliers and outputting as a most recent average power.

* * * * *